(12) United States Patent
Soltesz

(10) Patent No.: US 9,197,216 B2
(45) Date of Patent: Nov. 24, 2015

(54) MULTIPLEXING FOR SYSTEMS WITH MULTIPLE SUPPLY SOURCES

(71) Applicant: Broadcom Corporation, Irvine, CA (US)

(72) Inventor: Dario Soltesz, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/957,906

(22) Filed: Aug. 2, 2013

(65) Prior Publication Data

US 2015/0022239 A1    Jan. 22, 2015

Related U.S. Application Data

(60) Provisional application No. 61/856,885, filed on Jul. 22, 2013.

(51) Int. Cl.
 *H03K 19/20* (2006.01)
 *H03K 19/003* (2006.01)
 *H03K 17/62* (2006.01)

(52) U.S. Cl.
 CPC ............ *H03K 19/20* (2013.01); *H03K 17/6221* (2013.01); *H03K 19/00361* (2013.01)

(58) Field of Classification Search
 None
 See application file for complete search history.

(56) References Cited

U.S. PATENT DOCUMENTS 6,163,199 A * 12/2000 Miske et al. ............... 327/434
6,373,291 B1 * 4/2002 Hamada et al. ............ 326/113

* cited by examiner

*Primary Examiner* — Jany Richardson
(74) *Attorney, Agent, or Firm* — Brinks Gilson & Lione

(57) ABSTRACT

A system includes an inverter element to gate forward current flow from a first signal source, and a reverse current inhibition element to block reverse current flow towards the first signal source from a second signal source.

20 Claims, 7 Drawing Sheets

MULTIPLEXING FOR SYSTEMS WITH MULTIPLE SUPPLY SOURCES

PRIORITY CLAIM

This application claims priority to U.S. Provisional Application Ser. No. 61/856,885, filed Jul. 22, 2013, which is incorporated herein by reference in its entirety.

TECHNICAL FIELD

This disclosure relates generally to signal multiplexing systems and methods. It also relates to a multiplexing in systems with multiple supply sources.

BACKGROUND

A multiplexer receives multiple input signals and directs the input signals to a single output. Multiplexers may accept various input signals with differing characteristics. The multiplexer may apply switching or signal combination techniques to provide output access to multiple input signals. For example, inputs may be given access to the output for limited period in a time domain multiplexing scheme. Similarly, frequency or code based schemes may be used.

BRIEF DESCRIPTION OF THE DRAWINGS

The innovation may be better understood with reference to the following drawings and description. In the figures, like reference numerals can designate corresponding parts throughout the different views.

DETAILED DESCRIPTION

A multiplexer may operate to manage access to an output for a number of input sources. For example a multiplexer may receive inputs from several sensors sharing a single set of processing elements (e.g. analog-to-digital converters (ADCs), global positioning system (GPS) chips, digital signal processors (DSPs), processors, and/or other processing elements. The multiplexer may prevent unwanted current flow between signal sources through the multiplexer.

Figure 1:
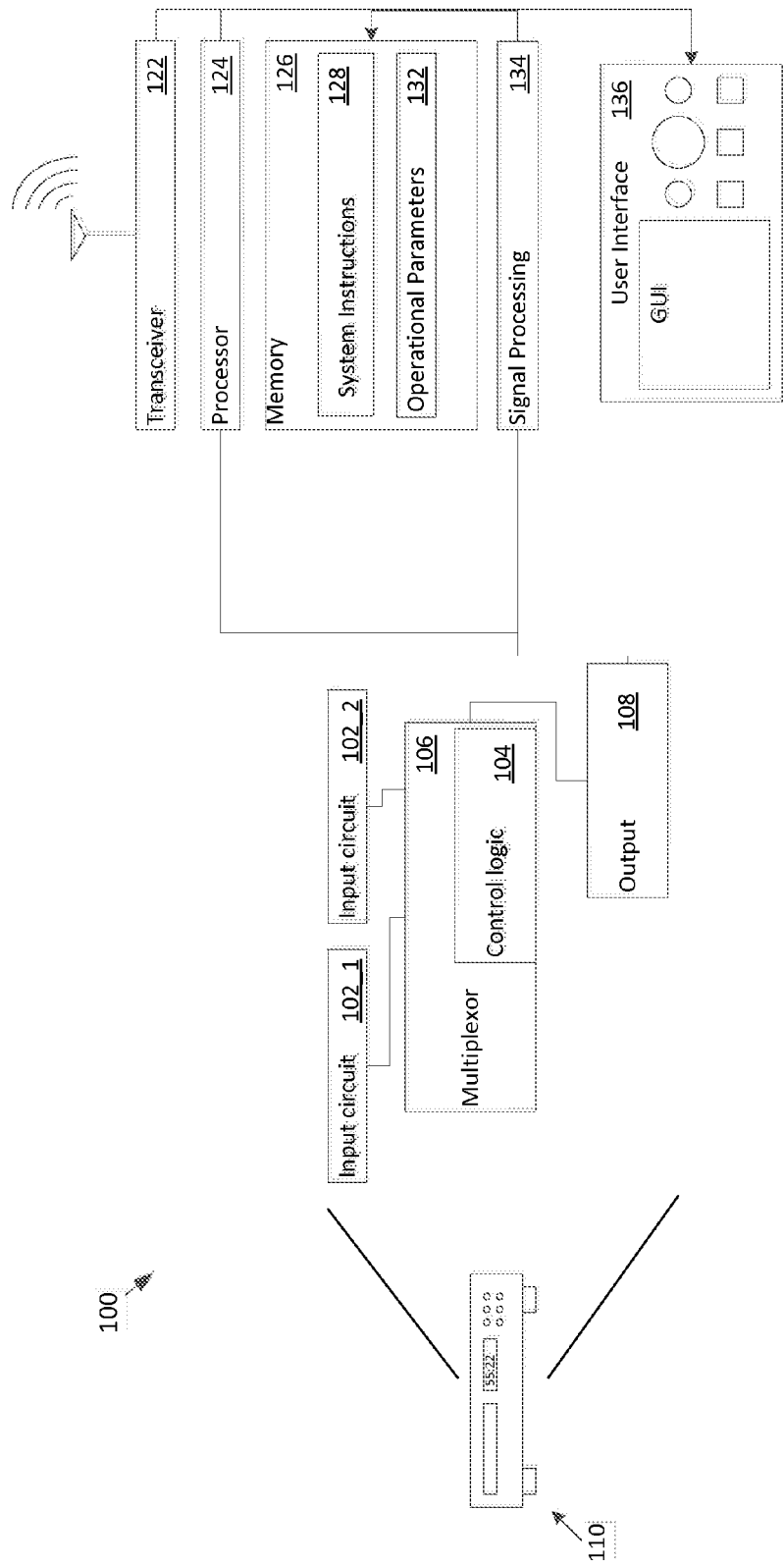
FIG. 1 is a block diagram of an example multiplexer environment.

FIG. 1 is a block diagram of an example multiplexer environment. In this multiplexer environment 100, input circuits 102_1, 102_2 (e.g. sensors, etc.) on device 110 generates signals based on one or more conditions. The control logic 104 directs the multiplexer 106 to open a pathway the processing element 108 for the signal from input circuit 102_1. A pathway from the input circuit 102_2 to output 108 is closed. In one example, the device is a communication device, such as a cell phone, smartphone, tablet, laptop, or a portable gaming system. However, the device may be virtually any device implementing one or more multiplexers. For example, cable or satellite television set-top boxes (STBs), GPS devices, or modems may use such multiplexers.

The device 110 may include transceiver elements 122 to support RF communication, one or more processors 124 to support execution of applications and general operation of the device. The applications may use signals from the input circuits in their operation. The device may include memory 126 for execution support and storage of system instructions 128 and operation parameters 132. Signal processing hardware 134 (e.g. ADCs, baseband processors etc.) may also be included to accept outputs from the multiplexer 106 and/or to support decoding/encoding RF signaling. The communication device may include a user interface 136, for example a display and graphical user interface, to allow for user operation of the device.

Figure 2:
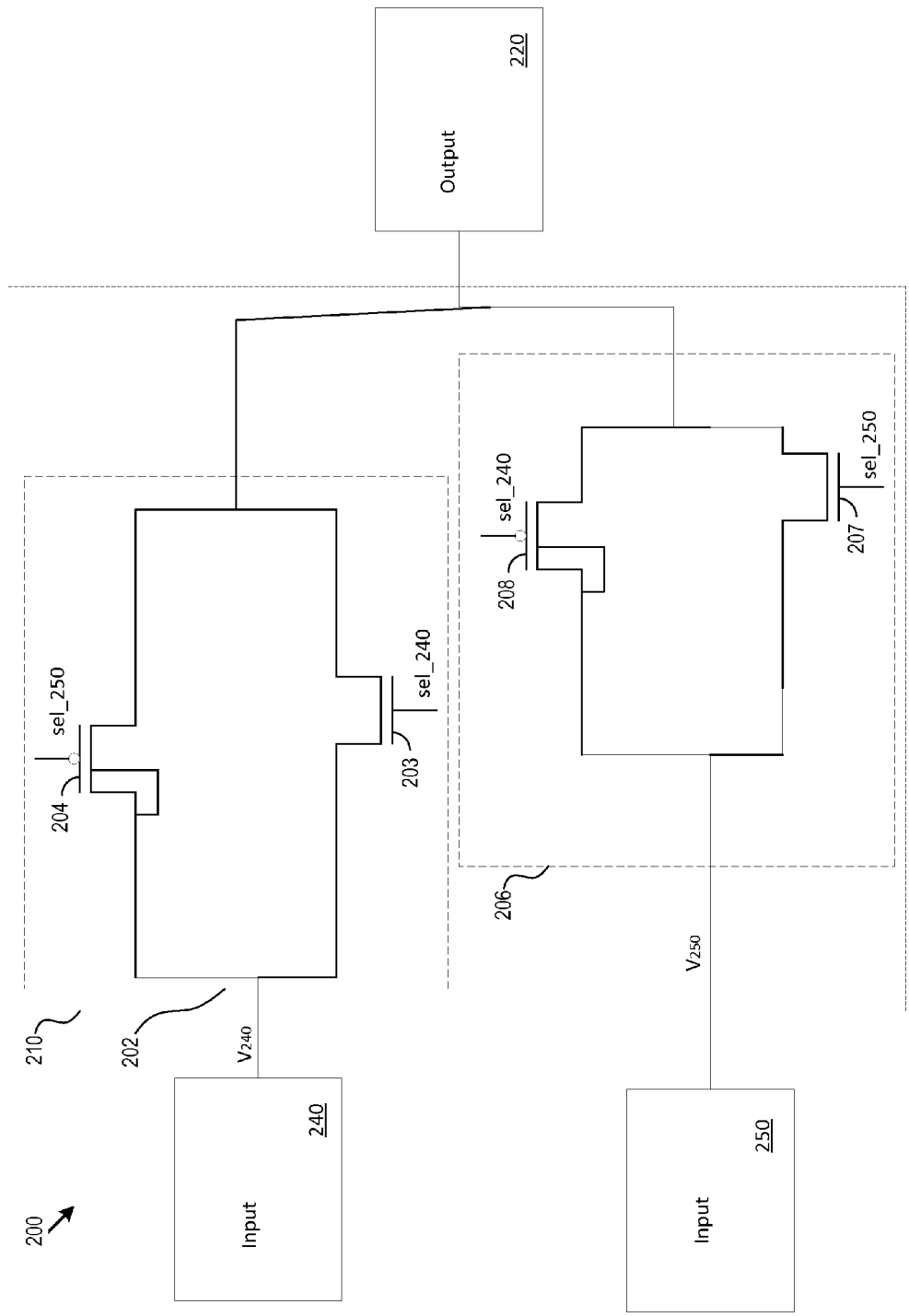
FIG. 2 is a circuit diagram of an example multiplexer system.

FIG. 2 is a circuit diagram of an example multiplexer system. The multiplexer system 200 includes a multiplexer 210 which accepts inputs from multiple signal sources (240, 250) and manages the sources' pathway to output element 220. The signal source 240 may produce a signal $V_{240}$ which serves as the input to multiplexer element 202. Signal source 250 may produce a signal $V_{250}$ which serves as the input to multiplexer element 206. The multiplexer elements are controlled via selection signals sel_240 and sel_250.

The multiplexer element 202 includes transistors 203 and 204. The multiplexer element 206 includes transistors 207 and 208. Transistors 203 and 207 are negative metal oxide semiconductor (nMOS) and transistors 204 and 208 are positive metal oxide semiconductor (pMOS). Additionally or alternatively, other types of transistors can be used. The parallel configuration of nMOS and pMOS transistors may allow multiplexer elements 202 and 206 to act as a normal wire when both the nMOS and pMOS transistors are "ON" (allowing current to flow). The transistors 203 and 208 accept sel_240 as a gate input. The transistors 204 and 207 accept sel_250 as a gate input. The signals sel_240 and sel_250 may be derived from multiplexer supply signal $V_s$. In one case, sel_240 may switch between values of $V_s$ (or zero) and sel_250 may take on values of zero (or $V_s$). Thus, when sel_240 is high sel_250 may be low and when sel_240 is low sel_250 may be high. When sel_240 is high, multiplexer element 240 allows current to flow. When sel_250 is high, multiplexer element 250 allows current to flow. If $V_s$ is set to a small magnitude value (e.g. zero or near zero, etc.), both sel_240 and sel_250 may be low. In some cases, this may correspond to turning off the multiplexer system or placing the system in a power save mode (or other low power mode). When $V_s$ is set to such a small magnitude value, $V_{240}$ and $V_{250}$ may have relatively large magnitudes. In some cases, the values of $V_{240}$ and $V_{250}$ may be allowed to float while $V_s$ is set to a small magnitude value.

In the multiplexer system 200 if $V_{240}$ is greater than $V_s$ and $V_{250}$, current may flow from signal source 240 to signal source 250 through multiplexer 210. Similarly, if $V_{250}$ is greater than $V_s$ and $V_{240}$ current may flow in the opposite direction. For floating values of $V_{240}$ and $V_{250}$ and small magnitude values of $V_s$, current may flow in either direction as $V_{240}$ and $V_{250}$ float among different values. In some cases, these current flows may cause undesirable operation. Thus, it may be advantageous to implement a system which prevents current flow between signal sources through the multiplexer for various signal level combinations.

In addition, pMOS transistors 204 and 208 may have multiple paths for current flow. One path is the channel controlled by the gate input. The second path is a parasitic path across the substrate of the transistor itself. The parasitic path is not controlled by the gate. The parasitic path may only allow unidirectional flow, and may be dependent on the design of the transistor. The parasitic current flow may lead to undesirable operation. Thus, it may be advantageous to implement a system which prevents the parasitic current flow.

Figure 3:
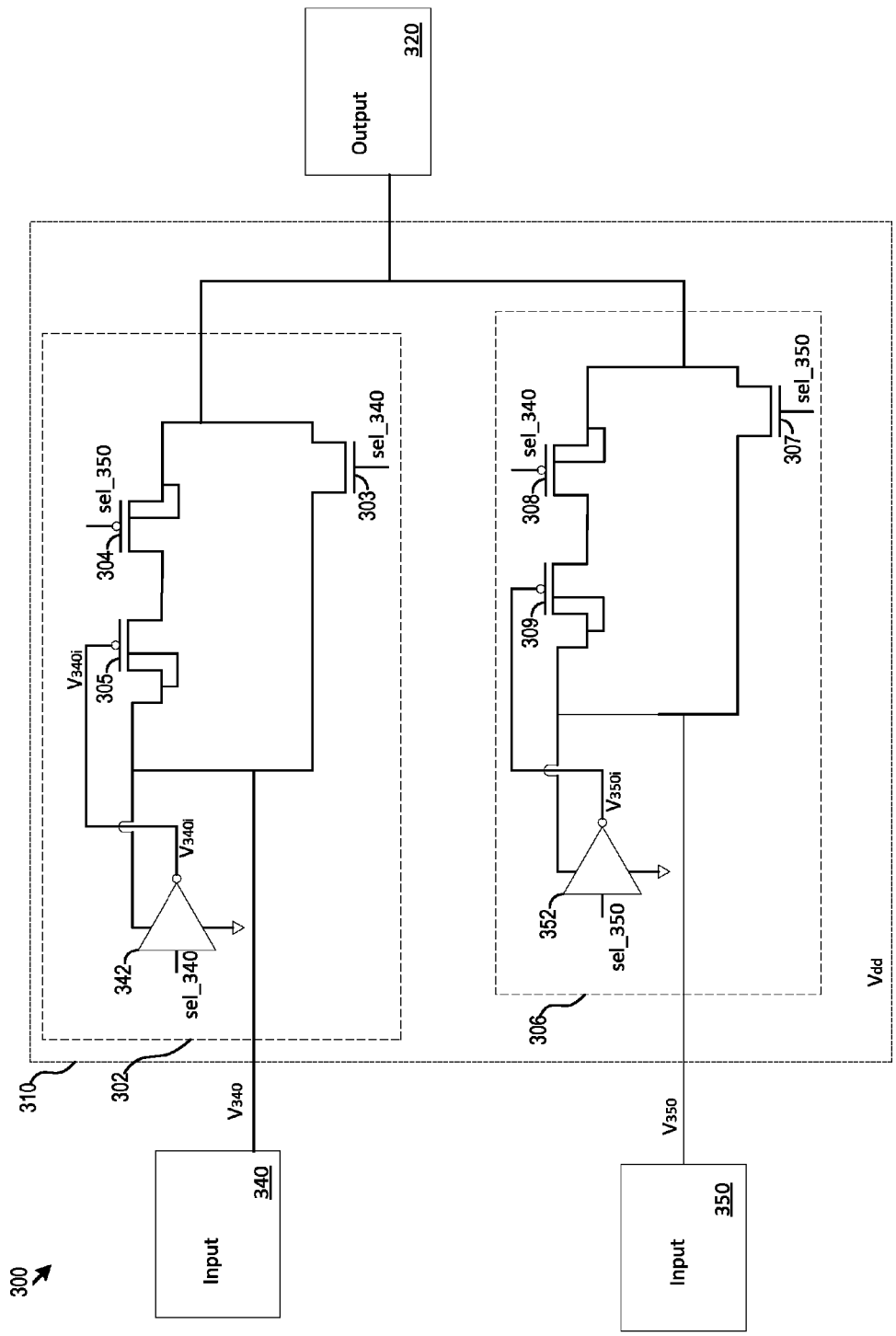
FIG. 3 is a circuit diagram of an example multiplexer system.

FIG. 3 is a circuit diagram of an example multiplexer system. In various implementations, the multiplexer 310 may be configured to prevent current flow between the input circuits (340, 350) connected to the output element 320 via the multiplexer for various input and supply voltage combinations. In some cases, such current flows are inhibited for zero or low supply voltage values (relative to one or more input signal values).

The multiplexer system 300 includes a multiplexer element 310 which accepts inputs from multiple signal sources (340, 350) and manages the sources' pathway to output element 320. The signal source 340 may produce a signal $V_{340}$ which serves as the input to multiplexer element 302. Signal source 350 may produce a signal $V_{350}$ which serves as the input to multiplexer element 306. The multiplexer elements are controlled via selection signals sel_340 and sel_350. The multiplexer element 302 includes transistors 303, 304, and 305 and inverter 342. The multiplexer element 306 includes transistors 307, 308, and 309 and inverter 352. Transistors 303 and 308 and inverter 342 accept sel_340 as a gate input. Inverter 342 accepts sel_340 as a first input and $V_{340}$ as a second input. Transistor 305 accepts the output of inverter 342 as a gate input. The transistors 304 and 307 accept sel_350 as a gate input. Inverter 352 accepts sel_350 as a first input and $V_{350}$ as a second input. Transistor 309 accepts the output of inverter 352 as a gate input.

The signals sel_340 and sel_350 may be derived from supply signal $V_{dd}$ (e.g. a supply voltage for the multiplexer system). In some cases, sel_340 may switch between values of $V_{dd}$ (or zero) and sel_350 may take on values of zero (or $V_{dd}$). When sel_340 is low, inverter 342 passes signal $V_{340}$ and provides it ($V_{340i}=V_{340}$) as a gate input to transistor 305. Thus, the signal ($V_{340i}$) used to gate $V_{340}$ may be proportional to $V_{340}$. Transistor 305 may be effective in inhibiting current flow for low magnitude values of $V_{dd}$ and/or high magnitude values of $V_{340}$ (When $V_{340}>V_{350}$). When sel_340 is high, the output of inverter 342 may be low regardless of the value of $V_{340}$. For example, a minimum signal level for inverter 342 may be passed (e.g. a ground, etc.) Similarly, when sel_350 is low, inverter 352 passes signal $V_{350}$ and provides it ($V_{350i}=V_{350}$) as a gate input to transistor 309. The signal ($V_{350i}$) used to gate $V_{350}$ may be proportional to $V_{350}$. Transistor 309 may be effective in inhibiting current flow for low magnitude values of $V_{dd}$ and/or high magnitude values of $V_{350}$ (e.g. when $V_{340}>V_{350}$). When sel_350 is high, the output of inverter 352 may be low regardless of the value of $V_{350}$.

In various implementations, transistors 304, 305, 308, and 309 may be pMOS and transistors 303 and 307 may be nMOS. pMOS transistors 304, 305, 308, and 309 may allow a gated current flow pathway and a parasitic current flow pathway. In some implementations, transistors 304 and 305 may be connected in series. Further, transistor 305 may be situated such that it forms a mirror image of transistor 304 structurally. Thus, any parasitic flow possible in transistor 304 is opposite in direction to any possible parasitic flow in transistor 305. In some cases this may prevent parasitic flow across both transistors 304 and 305. The use of gates, inverter 342 and inverter 352, and supplied by voltages $V_{340}$ and $V_{350}$ ensure that the transistors 305 and 309 are non-conductive when $V_{dd}$ is lower than $V_{340}$ and/or $V_{350}$. The use of transistor 304 in series with transistor 305, and transistor 308 in series with transistor 309 prevents unwanted current to flow through the substrates of transistors 304, 305, 308 and 309. In some cases the signals (e.g. $V_{dd}$, $V_{340}$, and $V_{350}$) may include negative values. In some implementations, transistors 304, 305, 308, and 309 may be nMOS and transistors 303 and 307 may be pMOS. nMOS transistors 304, 305, 308, and 309 may allow a gated current flow pathway and a parasitic current flow pathway. Mirror image structures may be implemented to inhibit the parasitic current flow pathways.

Figure 4:
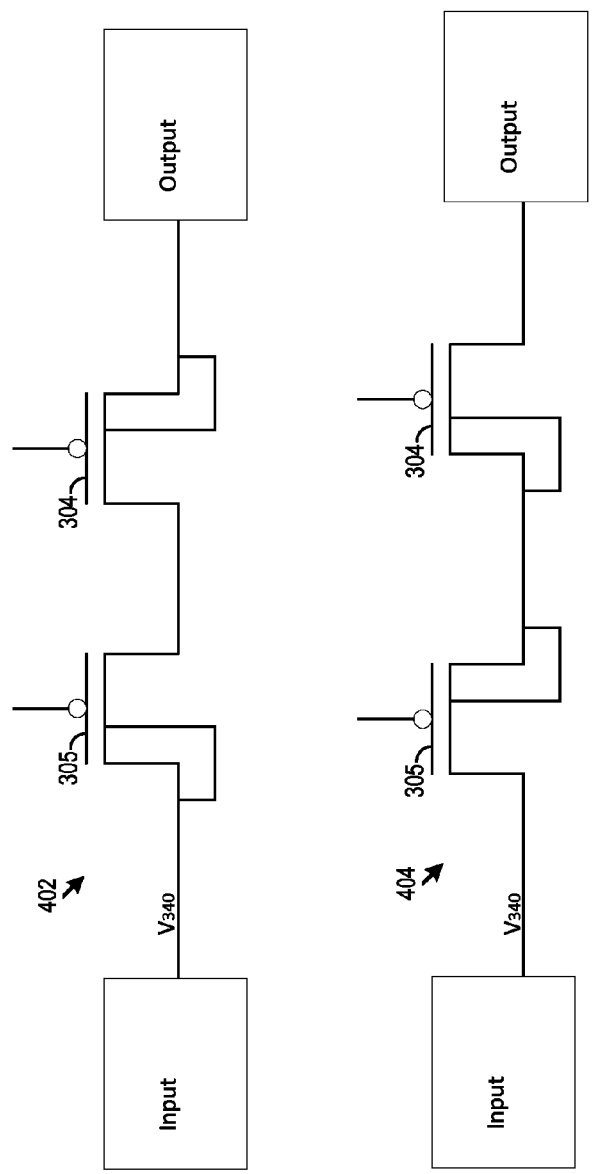
FIG. 4 is a circuit diagram showing example orientations of the transistors

FIG. 4 is a circuit diagram showing example orientations (402, 404) of the transistors. The transistors may be placed in either structural orientation with respect to signals $V_{340}$ and the output element when in this mirrored orientation with respect to each other (e.g. the transistors may be flipped). Transistors 308 and 309 may be situated in similar orientations.

Figure 5:
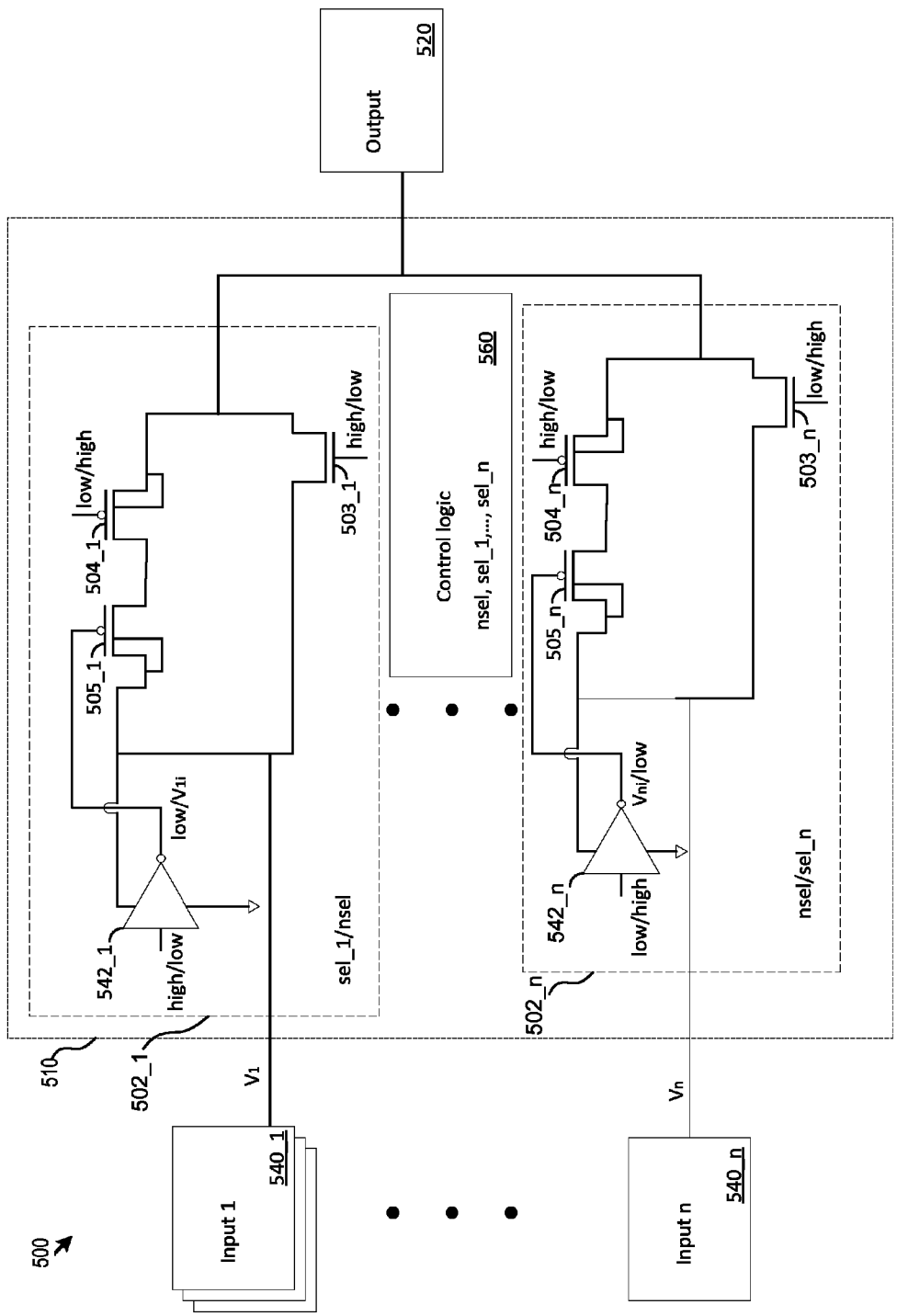
FIG. 5 is a circuit diagram of another example multiplexer system.

FIG. 5 is a circuit diagram of another example multiplexer system. The multiplexer system 500 may include an arbitrary number of input circuits (540_1, . . . , 540_n). Transmission of input signals ($V_1$, . . . , $V_n$) to the output element 520 is managed by corresponding multiplexer elements (502_1, . . . , 502_n). The multiplexer elements include inverters (542_1, . . . , 542_n), and transistors (503_1, . . . , 503_n; 504_1, . . . , 504_n; 505_1, . . . , 505_n). In various implementations, transistors (503_1, . . . , 503_n) allow transmission in response to a logical high at their gate and inhibit transmission in response to a logical low at their gate; transistors (504_1, . . . , 504_n; 505_1, . . . , 505_n) allow transmission in response to a logical low at their gate and inhibit transmission in response to a logical high at their gate. Further, inverters (542_1, . . . , 542_n) output a logical low in response to a logical high control signal and output an inverted input in response to a logical low control signal. When an input signal is selected for transmission to the output element by control logic 560, an associated selection signal (sel_1, . . . , or sel_n) is applied by the control logic to the multiplexer system. The application of the selection signal may cause logical highs and lows to be applied to the proper transistors to allow transmission. For example, application of sel_1 may cause a logical high to be applied to inverter 542_1 and transistor 503_1 and a logical low to be applied to transistor 504_1. In some implementations, sel_1 may itself include the proper logical highs and lows. Other multiplexer elements may have a non-selection signal (nsel) applied. Similarly, the non-selection signal may cause the proper signals for transmission inhibition to be applied in response to its application or the non-selection signal may include the application of the proper signals for transmission inhibition.

Figure 6:
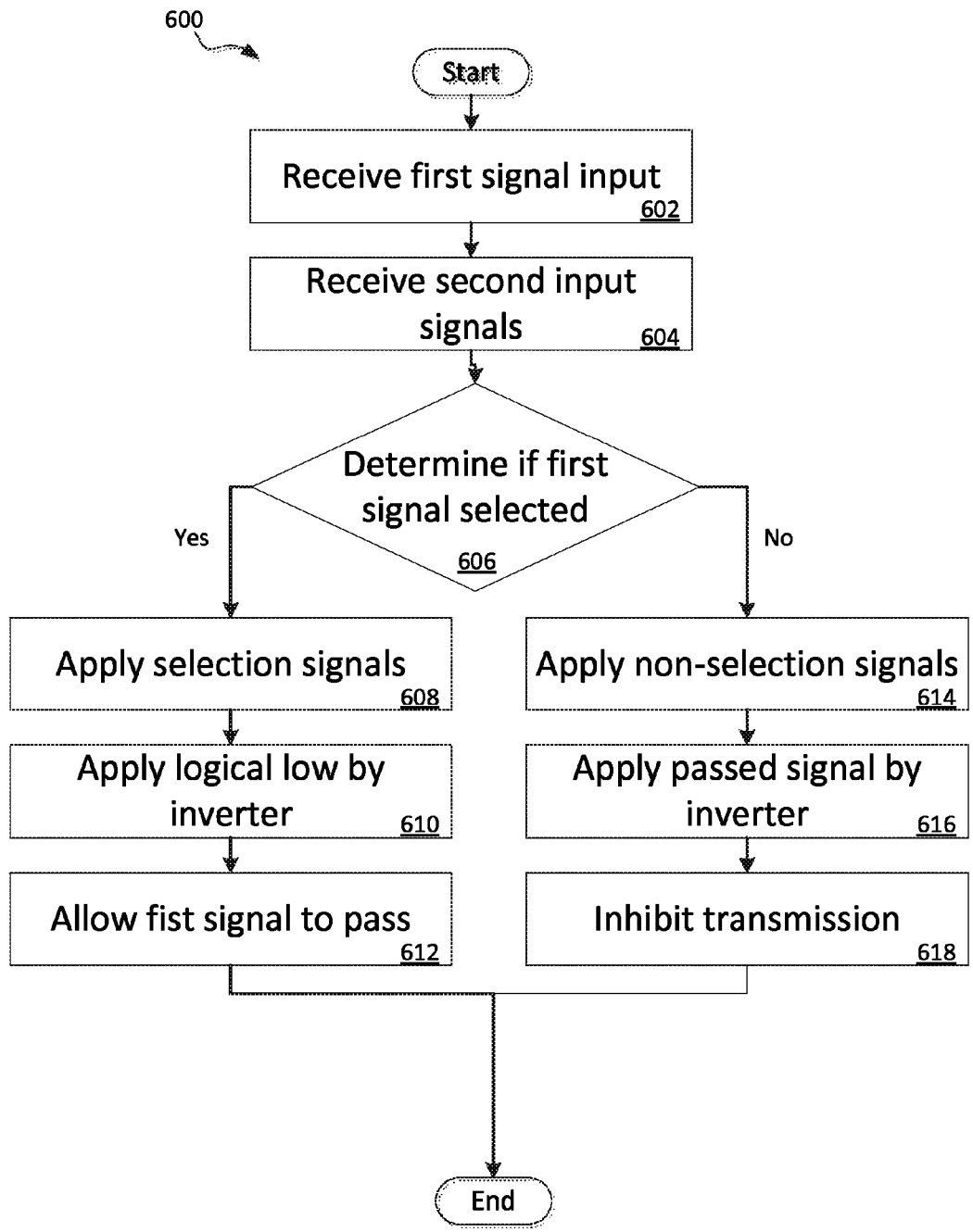
FIG. 6 is a logical-flow diagram showing example logic for restricting reverse current flow.

FIG. 6 is a logical-flow diagram showing example logic for restricting current flow. A first input signal is received at a multiplexer element (e.g. 340, 540_1) from a first input circuit (602). One or more second input signals are received at one or more multiplexer elements (e.g. 350, 540_2, . . . , 540_n) from one or more second input signals (604). The logic 600 may determine if the first input signal may be selected for transmission to an output element (606).

If the logic 600 determines that the first signal is selected one or more selection signals associated with the first input circuit are applied by the multiplexer system (608). The multiplexer system may apply a logical high to an inverter (e.g. 342, 542_1) and the gate of a first transistor (e.g. 303, 503_1) of a first multiplexer element, and may apply a logical low to the gate of a second transistor (e.g. 304, 504_1) of the first multiplexer element. The selection signals may include the applied logical highs and lows or the logical highs and lows may be applied in response to the selection signals. In response to the logical high applied to the inverter a logical low (e.g. a minimum output value for the inverter) is applied to third transistor (e.g. 305, 505_1) at its gate (610). The first transistor may allow current flow in response to a logical high, and inhibit current flow in response to a logical low. The second and third transistors may allow current flow in response to a logical low, and inhibit current flow in response to a logical high. Thus in response to the applied logical highs and lows, the three transistors allow the first signal to pass to the output element (612).

If the logic 600 determines that the first signal is not selected, one or more non-selection signals associated with the first input circuit are applied by the multiplexer system (614). The multiplexer system may apply a logical low to the inverter and the gate of the first transistor, and may apply a logical high to the gate of the second transistor. The non-selection signals may include the applied logical highs and lows or the logical highs and lows may be applied in response to the non-selection signals. In response to the logical low applied to the inverter, the inverter passes the first signal to the gate of the third transistor (616). In response to the logical low and logical high, the first and second transistors inhibit transmission from the first circuit to the output element (618). If the first signal has a sufficient magnitude, the passed first signal may correspond to a logical high and the third transistor may inhibit transmission. If the first signal lacks sufficient magnitude, the passed signal may correspond to a logical low and transmission may be allowed by the third transistor. However, no appreciable signal may be present to transmit. Further, transmission may still be blocked by the second transistor.

Figure 7:
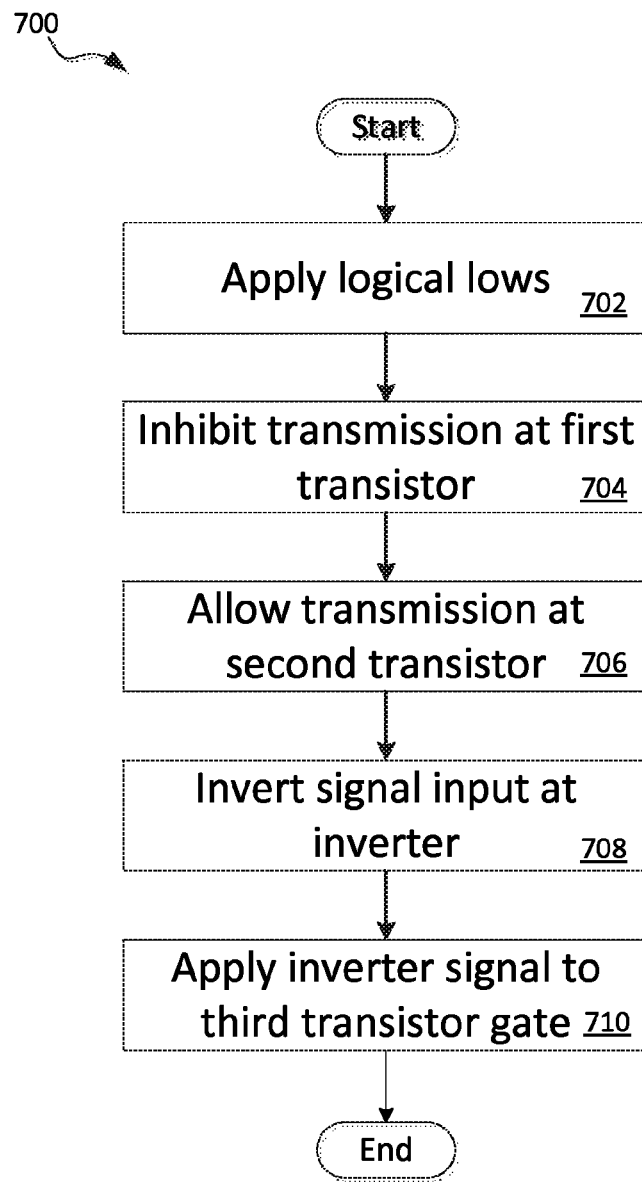
FIG. 7 is a logical flow diagram of an example method of inhibiting current flow.

FIG. 7 is a logical flow diagram of an example method of inhibiting current flow. If a multiplexer system is off or in a low power mode, the logic (e.g. 560, 600) may be unavailable for management of the system. The input circuits to the multiplexer system may remain active. In some implementations, the method 700 may be used to prevent improper current flows among the input circuits. Logical lows may be applied to the inverter (e.g. 342, 352, 542_1, . . . , 542_n), the first transistor (e.g. 303, 306, 503_1, . . . , 503_n), and the second transistor (e.g. 304, 308, 504_1, . . . , 504_n) of a multiplexer element (e.g. 302, 306, 502_1, . . . , 502_n) (702). A first input circuit may provide a signal to the multiplexer element. This may be consistent with a low power mode (or non-operation of the multiplexer system) and active input circuits. The first transistor may inhibit transmission of signals in response to the logical low (704). The second transistor allows transmission in response to the logical low (706). In response to the logical low, the inverter passes the input signal (708) and provides the signal to the gate of the third transistor (e.g. 305, 309, 505_1, . . . , 505_n) (710). If the input signal has sufficient magnitude, the signal may act as a logical high. In this case, the third transistor inhibits transmission. If the input signal does not have sufficient magnitude, the signal may act as a logical low and transmission may not be inhibited by the third transistor. The low magnitude input signal may not cause appreciable current transfers.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various implementations have been described, many more embodiments and implementations are possible. Accordingly, the description is not to be restricted.

What is claimed is:

1. A method, comprising:
applying a first control signal to an inverter element;
applying a second control signal to a first transistor of a multiplexer; and
applying the first control signal to a third transistor;
in response to the second control signal, allowing signal flow across the first transistor;
in response to the first control signal:
passing a signal input to a gate of a second transistor of the multiplexer using the inverter; and
restricting signal flow across the third transistor; and
responsive to the signal input at the gate of the second transistor, restricting signal flow across the second transistor, the second transistor coupled to the first transistor in series, the third transistor coupled in parallel to the first and second transistors.

2. The method of claim 1 where the first and second transistors comprise positive metal oxide semiconductor (pMOS) transistors.

3. The method of claim 2 where the third transistor comprises a negative metal oxide semiconductor (nMOS) transistor.

4. The method of claim 1 where the first and second transistors are coupled in a mirrored configuration which restricts a parasitic current pathway.

5. The method of claim 1, wherein the first and second transistors and the inverter operate as a first gating circuit of multiple gating circuits; and
the method further comprises selectively applying the first and second control signals to ones of the multiple gating circuits to gate signal flow to a shared output.

6. The method of claim 5, where selectively applying the first and second control signals to ones of the multiple gating circuits comprises applying a selection signal to a second gating circuit of the multiple gate circuits; and in response to the selection signal, allowing signal flow across the second gating circuit.

7. The method of claim 1, further comprising indicating a low power mode via the control signal.

8. The method of claim 1, where passing the signal input to the gate of the second transistor restricts signal flow across the second transistor.

9. A circuit comprising;
a first transistor;
a second transistor connected in series with the first transistor, the first and second transistors situated in a mirrored configuration;
a third transistor connected in parallel with the first and second transistors; and
an inverter to, in a first mode, pass a input from a source and provide the input to a gate of the first transistor; and
responsive to the second transistor receiving a control signal, the third transistor and the second transistor configured to switch the circuit between the first mode in which transmission is allowed between the source and an output and a second mode in which transmission is restricted.

10. The circuit of claim 9 where the second mode comprises a low power mode of the circuit.

11. The circuit of claim 9 where in the first mode the inverter and the second transistor receive a logical high control signal.

12. The circuit of claim 9 where the second mode comprises an active mode of the circuit.

13. The circuit of claim 9 where the circuit comprises a component of a multiplexer system configured to manage transmission of multiple inputs to an output.

14. The circuit of claim 13 where the multiplexer system is configured to allow one input to transmit to the output at a time.

15. A device, comprising:
reverse current inhibition circuitry comprising:
a first transistor; and
a second transistor, the first and second transistors situated in series with one another;
the reverse current inhibition circuitry configured to:
block reverse current flow towards a first signal source from a second signal source when in a low power mode; and
allow an input to flow from a source to an output when in an active mode;
a third transistor coupled in parallel to the reverse current inhibition circuitry, the third transistor configured to:
switch between a low power mode and the active mode responsive to a selection signal different from the input, the selection signal configured to distinguish between the low power mode and the active mode;
restrict current flow in the low power mode; and
allow current flow in the active mode;
an inverter coupled to the reverse current inhibition circuitry, the inverter configured to:
when the selection signal indicates the low power mode, pass the input to a gate of the first transistor to restrict signal flow across the first transistor; and
when the selection signal indicates the active mode, allow signal flow across the first transistor; and
control circuitry coupled to the inverter, the control circuitry configured to apply the selection signal to the inverter.

16. The device of claim 15 where the first and second transistors are coupled such that the second transistor forms a structural mirror of the first transistor.

17. The device of claim 15 where the inverter is configured to, in the active mode, provide the input to the gate of the first transistor without inversion.

18. The device of claim 15 where:
the control circuitry is configured to, in the low power mode, provide a logical low to a gate of the second transistor to restrict current flow across the second transistor.

19. The device of claim 15 where the first and second transistors comprise positive metal oxide semiconductor transistors.

20. The device of claim 19 where the first and second transistors are situated in parallel with a negative metal oxide semiconductor transistor.

* * * * *